(12) United States Patent
Jain et al.

(10) Patent No.: US 6,312,134 B1
(45) Date of Patent: Nov. 6, 2001

(54) SEAMLESS, MASKLESS LITHOGRAPHY SYSTEM USING SPATIAL LIGHT MODULATOR

(75) Inventors: Kanti Jain, Briarcliff; Thomas J. Dunn, Mohegan Lake, both of NY (US); Jeffrey M Hoffman, Sierra Madre, CA (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 09/230,438

(22) Filed: Jan. 23, 1999

Related U.S. Application Data

(63) Continuation of application No. PCT/US96/12240, filed on Jul. 25, 1996.

(51) Int. Cl.⁷ .......................... G02B 7/182; G03B 27/70; G03B 27/54; G03B 27/72
(52) U.S. Cl. .................... 359/855; 359/224; 359/291; 355/35; 355/53; 355/67
(58) Field of Search .................... 359/855, 224, 359/291; 355/18, 35, 44, 53, 66, 67, 71

(56) References Cited

U.S. PATENT DOCUMENTS

| | | | | |
|---|---|---|---|---|
| 3,924,937 | * | 12/1975 | Munroe et al. | 359/211 |
| 4,073,572 | * | 2/1978 | Avicola | 359/583 |
| 4,283,116 | * | 8/1981 | Weis | 359/204 |
| 4,653,860 | * | 3/1987 | Hendrix | 35/900 |
| 4,676,702 | * | 6/1987 | Gerber | 355/53 |
| 5,105,369 | * | 4/1992 | Nelson | 355/53 |
| 5,227,839 | * | 7/1993 | Allen | 355/53 |
| 5,396,891 | * | 3/1995 | Vogt et al. | 355/67 |
| 5,448,395 | * | 9/1995 | Lopez et al. | 359/224 |
| 5,452,024 | * | 9/1995 | Sampsell | 359/224 |
| 5,473,410 | * | 12/1995 | Nishi | 355/53 |
| 5,477,304 | * | 12/1995 | Nishi | 335/53 |

* cited by examiner

Primary Examiner—Jon Henry
(74) Attorney, Agent, or Firm—Carl C. King

(57) ABSTRACT

The invention is a seamless projection lithography system that eliminates the need for masks through the use of a programmable Spatial Light Modulator (SLM) with high parallel processing power. Illuminating the SLM with a radiation source (1), which while preferably a pulsed laser may be a shuttered lamp or multiple lasers with alternating synchronization, provides a patterning image of many pixels via a projection system (4) onto a substrate (5). The preferred SLM is a Deformable Micromirror Device (3) for reflective pixel selection using a synchronized pulse laser. An alternative SLM is a Liquid Crystal Light Valve (LCLV) (45) for pass-through pixel selection. Electronic programming enables pixel selection control for error correction of faulty pixel elements. Pixel selection control also provides for negative and positive imaging and for complementary overlapping polygon development for seamless uniform dosage. The invention provides seamless scanning by complementary overlapping scans to equalize radiation dosage, to expose a pattern on a large area substrate (5). The invention is suitable for rapid prototyping, flexible manufacturing, and even mask making.

15 Claims, 7 Drawing Sheets

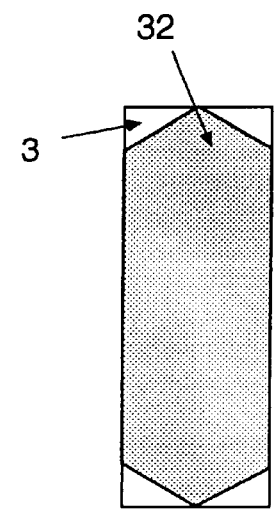
Fig. 5
Fig. 6
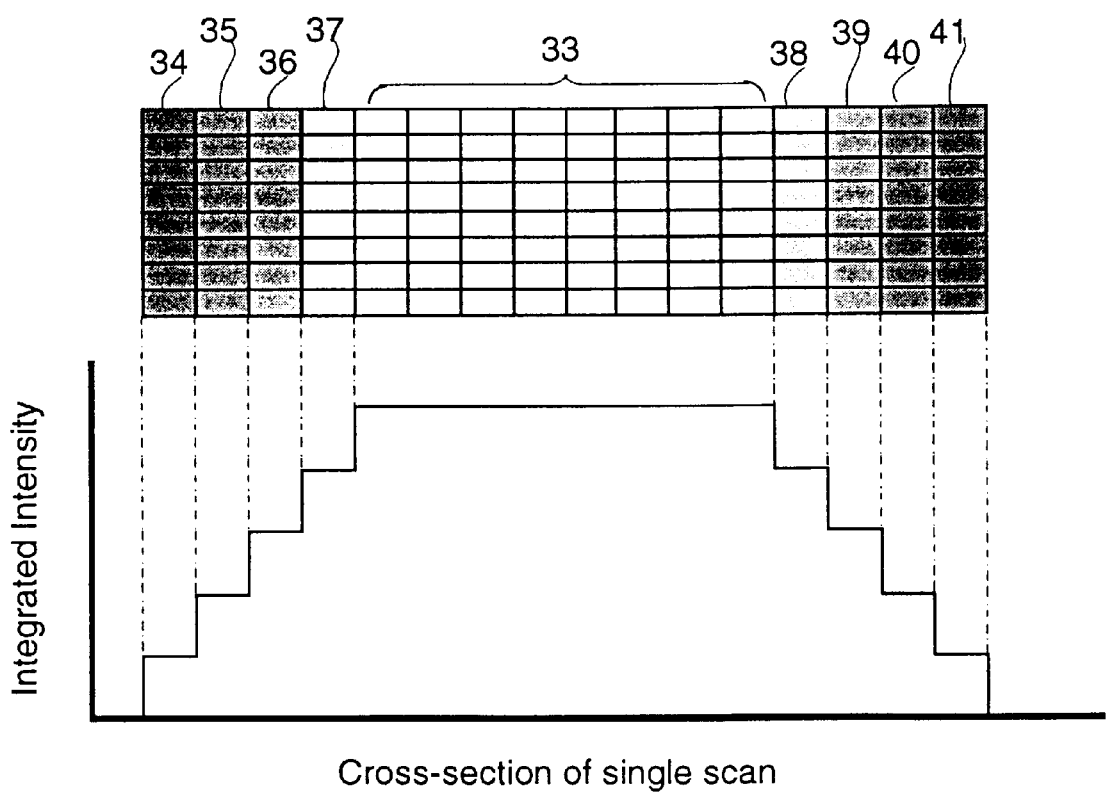
Cross-section of single scan

SEAMLESS, MASKLESS LITHOGRAPHY SYSTEM USING SPATIAL LIGHT MODULATOR

This application is a continuation of PCT/US96/12240 filed Jul. 25, 1996.

TECHNICAL FIELD

This invention relates to high-throughput lithography systems, and, more particularly, this invention relates to a maskless lithography system that provides large-area, seamless patterning using a spatial light modulator capable of being directly addressed by a control system.

BACKGROUND ART

High-throughput lithography systems are advantageous in the manufacture of many electronic and opto-electronic products, which require fabrication of millions of microscopic structures on a single large substrate. Such structures may be in the form of active devices, such as the transistors in an electronic display or in a semiconductor integrated circuit, or may be in the form of passive patterns, such as the metal interconnect network in a multichip packaging module or in a printed circuit board. The large substrate can be a display panel, a silicon wafer, or a board. The pattern feature sizes in these diverse products, which shall be referred to as electronic modules, range from sub-micron for semiconductor chips to multi-microns for displays and packaging products. The substrate size requirements vary from a few square centimeters for small modules to a few square feet for large displays.

A critical and common factor in the above applications is the need for a large-area patterning system that is capable of providing the required resolution over the entire substrate with high processing throughput. The patterning technology used determines not only the ultimate performance of the product (e.g., pixel density in a display, minimum device geometry in a chip, or interconnect density in a packaging module), but also the economics of the entire manufacturing process through such key factors as throughput and yield.

Conventional lithographic techniques that use masking technology involve a multi-step process which includes the photographic definition of patterns on optical masks which are used to impart these patterns onto the surfaces of individual substrates. The major exposure technologies used currently in patterning of electronic modules can be classified into three general categories:

(1) contact printing systems;
(2) conventional and step-and-repeat projection systems; and
(3) focused-beam laser direct-writing systems. Each of these will be briefly described below.

(1) Contact Printing Systems

A contact printer for substrate exposure consists of a fixture to align and hold the board (i.e., the substrate) in contact with the mask, which is then illuminated with high-intensity light to transfer the mask image to the board. Systems that can handle boards as large as 610 mm×915 mm (24"×36") are commercially available. A wide range of resolution capabilities is available in contact printers for different applications—from below a micron for semiconductor device fabrication to roughly 100 microns and larger for printed circuit board applications.

A desirable feature of contact printing systems is high throughput; however, the required use of contact masks contains a number of disadvantages. The process of designing and constructing a mask places a significant drag on the time required to build electronic module prototypes. The process of fabricating an electronic module involves the imaging of different layers and requires a different mask for each layer. The time required for switching and aligning masks as well as the expense of maintaining an array of masks for the production of a single electronic module represents a significant fraction of the cost of integrated circuit (IC) manufacturing. Eliminating the need for masks would reduce the long development time and minimize the high costs associated with IC production.

Furthermore, contact printing requires that, during exposure, the film or glass mask and the resist-coated board be brought in contact or near-contact. Good contact is difficult to produce over a large area. Poor contact, or a proximity gap, results in limited resolution. Frequent contact between the mask and the board causes generation of defects on the board which results in lower yields and causes reduction of the mask life, which leads to higher overall costs. In addition, variations in the gap cause feature size errors.

For certain electronic modules, such as flat panel displays (FPDs), the module size can be up to several square feet, requiring masks which are just as large. The technology to manufacture the masks themselves is a real impediment to manufacturing large-area FPDs. Eliminating the dependency on masks would sidestep this barrier; easing the difficulty of making the mask itself would be a great step forward.

(2) Projection Printing Systems

A wide variety of projection imaging systems are routinely used in fabrication of various electronic modules. Typically, a projection lens with a 1:1 magnification is used for imaging the mask pattern on the board. The illumination system uses a 1–2 kW mercury-xenon arc lamp, a heat-filtering mirror that filters away wavelengths in the visible and infrared regions, and a condenser to direct the radiation to the mask. All projection printing systems suffer from the limitation that there exists a trade-off between the resolution and the maximum image field size of the projection lens. For example, whereas 25 $\mu$m resolution can be obtained over approximately a 100 cm square field, the imaging area for 1 $\mu$m resolution must be limited to a field diameter no larger than 1–2 cm. For larger areas the total imaging field must be broken up into segments which then must be imaged one at a time in a step-and-repeat fashion, thereby limiting the available throughput. Most step-and-repeat systems use reduction imaging, typically with a 2:1, 5:1 or 10:1 ratio. Generally, systems with larger reduction ratios provide higher resolution, but also lower throughput.

Projection printing also requires the use of masks. As described above for contact printing systems, masking technology leads to many problems: use of masks does not allow for rapid prototyping of electronic modules; a different mask is required for subsequent layers of an electronic module, adding considerably to the expense of manufacturing; and the production capability of large-area masks does not meet all the current industry requirements for precision and accuracy at low cost and on fast schedules.

In addition, conventional projection imaging systems, due to fundamental lens-design considerations governing their performance, are forced to make a trade-off between resolution and image field size. This trade-off necessitates step-and-repeat imaging, in which significantly lower throughputs are obtained than by full-field contact printing. Lower throughputs result because each step involves the operations of load, unload, align, settle and focus. Step-and-repeat imaging also leads to higher costs due to the requirement of several masks and the errors introduced in stitching the different fields together.

The overlap or gap errors due to stitching the different fields together, usually referred to as "tiling," can be eliminated by complementary overlapping polygonal scans as described by a coinventor in U.S. Pat. No. 4,924,257, K. Jain, Scan And Repeat High Resolution Projection Lithography System, May 8, 1990.

U.S. Pat. No. 5,477,304, K. Nichi, Projection Exposure Apparatus, issued Dec. 19, 1995, uses a rectangular scanning aperture with a variable field stop, and uses orthogonally-moving mask stage and substrate stage to form a number of varying rectangles, in a tile pattern on a circular wafer.

Other systems use extensive shutter and blind components to form a useful exposure aperture, but still require a mask. See, as examples, U.S. Pat. No. 5,477,410, Projection Exposure Apparatus, issued Dec. 5, 1995, Nishi, and U.S. Pat. No. 5,227,839, Small Field Scanner, issued Jul. 13, 1993, Allen.

(3) Focused-Beam Direct-Writing Systems

A focused-beam direct-writing system uses a blue or UV laser in a raster scanning fashion to expose all the pixels, one at a time, on the substrate. The laser beam is focused on to the resist-coated board to the desired spot size. The focused spot is moved across the board in one dimension (say, along the y-axis) with a motor-driven scanning mirror. In conjunction, the stage holding the board is translated in the orthogonal dimension (x-axis) with a high-precision stepping motor. Simultaneously, the laser beam is modulated (typically, acousto-optically) to be either directed to the desired location on the board or deflected away. Thus, by driving the modulator and the two motors with appropriately processed pattern computer aided design (CAD) data, the entire board can be directly patterned. Of the many systems currently available, the offered resolution varies from 13–25 $\mu$m for printed circuit board patterning to under a micron for systems designed for semiconductor applications. Since transfer of the pattern information in a scanning-spot direct-write tool takes place in a slow, bit-by-bit serial mode, typical processing times for such systems can range from 2 minutes to several hours per sq. ft., depending upon the resolution and the complexity of the pattern data.

Thus, although direct-write systems avoid the problems associated with using masks, they are extremely slow because transfer of the pattern information takes place in a bit-by-bit serial mode. Due to the large number of pixels ($\sim 10^8$–$10^{10}$) that must be written on an electronic module, typical processing times with such systems are unacceptably long for cost-effective volume manufacturing. Direct-write systems, therefore, are best suited for applications such as mask fabrication and prototyping.

From the above descriptions, it is clear that existing technologies for microelectronic patterning suffer from critical limitations. Thus there exists a need for a patterning system with the throughput of contact printers, the high resolution available from projection imaging, and the maskless feature of direct writing, without any of the disadvantages described above. The invention disclosed herein delivers all of the above performance and cost features in a patterning system, namely: a system which is maskless, has large-area capability, and images with high resolution, high throughput, and high yield.

The preferred embodiments of the invention rely on technologies such as the following:

1. Seamless scanning technology, developed by Anvik Corporation;

2. Deformable micromirror device (DMD) technology, developed by Texas Instruments, Inc.; and
3. Liquid crystal light valve technology, part of a vast field of technology and developed by numerous researchers.

These technologies are described below.

Seamless Scanning Technology

Seamless scanning patterning technology, invented by K. Jain, achieves the high-resolution, large-area, and high-throughput capabilities by a novel "scan-and-repeat" exposure mechanism. Exposure of arbitrarily large image fields, while maintaining the desired resolution, is made possible by a "seamless" scanning technique using partially overlapping complementary polygonal scans.

The following U.S. Patents are useful for the understanding of the seamless scanning technology applied to this invention:

U.S. Pat. No. 4,924,257, Scan and Repeat High Resolution Lithography System, K. Jain, May 8, 1990;

U.S. Pat. No. 5, 285,236, Large-Area, High-Throughput, High-Resolution Projection Imaging System, K. Jain, Feb. 8, 1994; and U.S. Pat. No. 5,059,013, Illumination System to Produce Self-Luminous Light Beam of Desired Cross-Section, Uniform Intensity and Desired Numerical Aperture, K. Jain, Oct. 22, 1991.

Deformable Micromirror Device Technology

The Deformable Micromirror Device (DMD) is an opto-mechanical system which acts as a spatial light modulator that works in the reflective mode. The device consists of an array of hinged micromirrors which fit on a chip, each micromirror having the capability of tilting in two different rotations about an axis. When the micromirrors tilt in one direction, they may reflect radiation through an optical system, for imaging; thus these micromirrors are described as turned "on." Micromirrors that tilt in the other direction reflect radiation so that it does not pass through the optical system. These mirrors are turned "off." The set of micromirror devices arranged in an array, then, is the object of an imaging system where the "on" mirrors form the bright pixels of the object while the "off" mirrors form the dark pixels.

The following references are useful for the understanding of Deformable Micromirror Device (DMD) technology:

Hornbeck, Larry J., SPIE Critical Reviews Series, v. 1150, 1989, p. 86.

Younse, Jack M., IEEE Spectrum, November, 1993, p. 27.

Liquid Crystal Light Valve Technology

There are several systems that are capable of producing images utilizing deformable micromirror devices, but none provide a seamless pattern on a large substrate.

U.S. Pat. No. 5,504,629, Optical Projection System With A Novel Lens System, issued Apr. 2, 1996, D. Lim, shows a deformable micromirror device used to produce an image. However, Lim equips each individual micromirror with a baffle and microlens to vary the intensity of each image point produced.

Another application of deformable micromirror devices is shown in U.S. Pat. No. 5,452,024, DMD Display System, issued Sep. 19, 1995, J. Sampsell. Sampsell shows deformable micromirror devices used to produce an image for High Density Television (HDTV). Intensity is controlled by mirror ON-time, not by successive overlapping exposures. There is no scanning ability and no system for image error correction.

U.S. Pat. No. 5,105,369, Printing System Exposure Module Alignment Method and Apparatus of Manufacture, issued Apr. 14, 1992, W. Nelson, discloses a deformable micromirror device system that has scanning capability. Nelson discloses the use of a deformable micromirror device to produce an inverted image on a printing drum. Nelson shows no error correction, and the scanning is limited to one direction, the width of the deformable micromirror device array.

U.S. Pat. No. 5,296,891, Illumination Device, issued Mar. 22, 1994, H. Vogt et al., discloses an imaging system using a variable diffraction surface light modulator to provide a pattern, and using a schlieren lens system to project the pattern and eliminate non-pattern light. Vogt et al. requires a mirror (17) to block undiffracted light, and, if mirror (17) is partly reflecting, a shutter placed in the beam path to filter out the zeroth-order diffraction light (undiffracted light) which is reflected from the non-pattern areas of the surface light modulator.

A Liquid Crystal Light Valve (LCLV) is an electro-optic device which operates as a spatial light modulator in transmissive mode. It is programmable and has an array of pixels which can be directly addressed by a control system. Because the pixels are capable of switching from opaque to transmissive, they can be programmed to display desired images on the array itself. The LCLV thus can be used in transmissive mode to transmit images through an optical system.

U.S. Pat. No. 4,653,860, Programmable Mask or Reticle With Opaque Portions on Electrodes, issued Mar. 31, 1997, J. Hendrix, and Statutory Invention Register Disclosure H152, Method and System for High Speed Photolithography, B. Geil, Apr. 2, 1996, disclose using a liquid crystal as a shutter. Neither Hendrix nor Geil has scanning capabilities or complementary overlap for tiling error elimination.

There are exposure systems that are capable of scanning, but with limitations.

U.S. Pat. No. 5,045,419, Pattern Exposure/Transfer Method and Pattern Exposure/Transfer Mask Apparatus, K. Okumara, Sep. 3, 1991, discloses a system that utilizes collimated light and a liquid crystal mask. There is no error correction or overlap provided for and more complex patterning requires a plurality of liquid crystal masks.

U.S. Pat. No. 4,675,702, Photoplotter Using a Light Valve Device and Process for Exposing Graphics, issued Jun. 23, 1987, H. Gerber, describes a system wherein an image is exposed by varying the transmisivity of the liquid crystal light valve. Intensity is controlled by the time a valve remains open. Although there is some scanning capability, there are no provisions for seamless scanning or error correction.

U.S. Pat. No. 5,448,395, Non-mechanical Step Scanner for Electro-Optical Sensors, issued Sep. 5, 1995, M. Lopez discloses another method of using a liquid crystal light valve, using mechanical shutters. Scanning is accomplished by sequentially opening shutters, creating a mosaic of an image. There is no overlap capability; therefore there is no error correction and there may be seams in the final image.

There are a number of known techniques for distributing and combining laser pulses. See, as examples, U.S. Pat. No. 3,924,937, Method and Apparatus for S Sequentially Combining Pulsed Beams of Radiation, issued Dec. 9, 1975, J. Munroe at al; U.S. Pat. No. 4,073,572, System for Increasing Laser Pulse Rate with Beam Splitters, issued Feb. 14, 1978, K. Avicola; U.S. Pat. No. 4,283,116, Beam Combiner, issued Aug. 11, 1981, J. Weis. Munroe et al., discloses a technique for combining radiation pulses in plural beams to provide increased repetition rate, with optical correction for angular motion. Avicola discloses a technique for increasing laser pulse rate using beam splitters. Weis discloses an optical pulse distributor.

One embodiment of the invention disclosed integrates the seamless scanning system with Deformable Micromirror Device (DMD) technology, while another embodiment uses the seamless scanning system with Liquid Crystal Light Valve (LCLV) technology. The need for conventional masks is thereby eliminated. Furthermore, the invention enables high processing throughputs to be achieved, while maintaining high resolution over arbitrarily large image fields.

Disclosure of Invention

The invention is a maskless patterning system which is capable of imaging electronic modules by delivering high resolution over a large image field, with high exposure throughput. It is the object of the invention to eliminate the need for masks in the imaging of patterns on electronic modules, through the use of seamless scanning and a spatial light modulator that is directly addressed by a control system. Another object of the invention is to retain choice of light source, including laser and halogen lamp, and choice of spatial light modulator, including a deformable micromirror device (DMD) and an array of liquid crystal light valves (LCLVs). A seamless lithography system is incorporated here to achieve high resolution, large area, and high throughput by a scan-and-repeat exposure mechanism. Another object of the invention is to enable patterning of substrate panels that are several times greater in size than is currently possible. For a given panel size, processing throughput is increased substantially, at the same time that high resolution is maintained over the entire substrate. A feature of the invention is to achieve seamless scanning through electronically programming the spatial light modulator. The DMD or LCLV array is configured to reflect or transmit an image with a particular intensity profile, part of which may be integrated with the intensity profile of an overlapping, adjacent scan. Another feature of the invention is that the entire spatial light modulator may be illuminated so as to allow the modulator itself to generate the intensity profile characteristic of a scanning hexagonal field. An advantage of the invention is that it corrects for image reversal with the stream of data that is loaded onto the spatial light modulator, thus obviating the need for image reversing optics. Another advantage of the invention is its versatility, which enables it to be used in the production of several high-volume electronic products. A further advantage of the invention is that it eliminates the shortcomings of conventional contact, projection, and direct-writing systems.

BRIEF DESCRIPTION OF DRAWINGS

FIG. 5 shows an illumination pattern on a DMD chip which allows for seamless scan ring.

FIG. 6 is a chart showing how light gradients are applied in complementary fashion to achieve seamless optical scanning.

MODES FOR CARRYING OUT THE INVENTION

Figure 1:
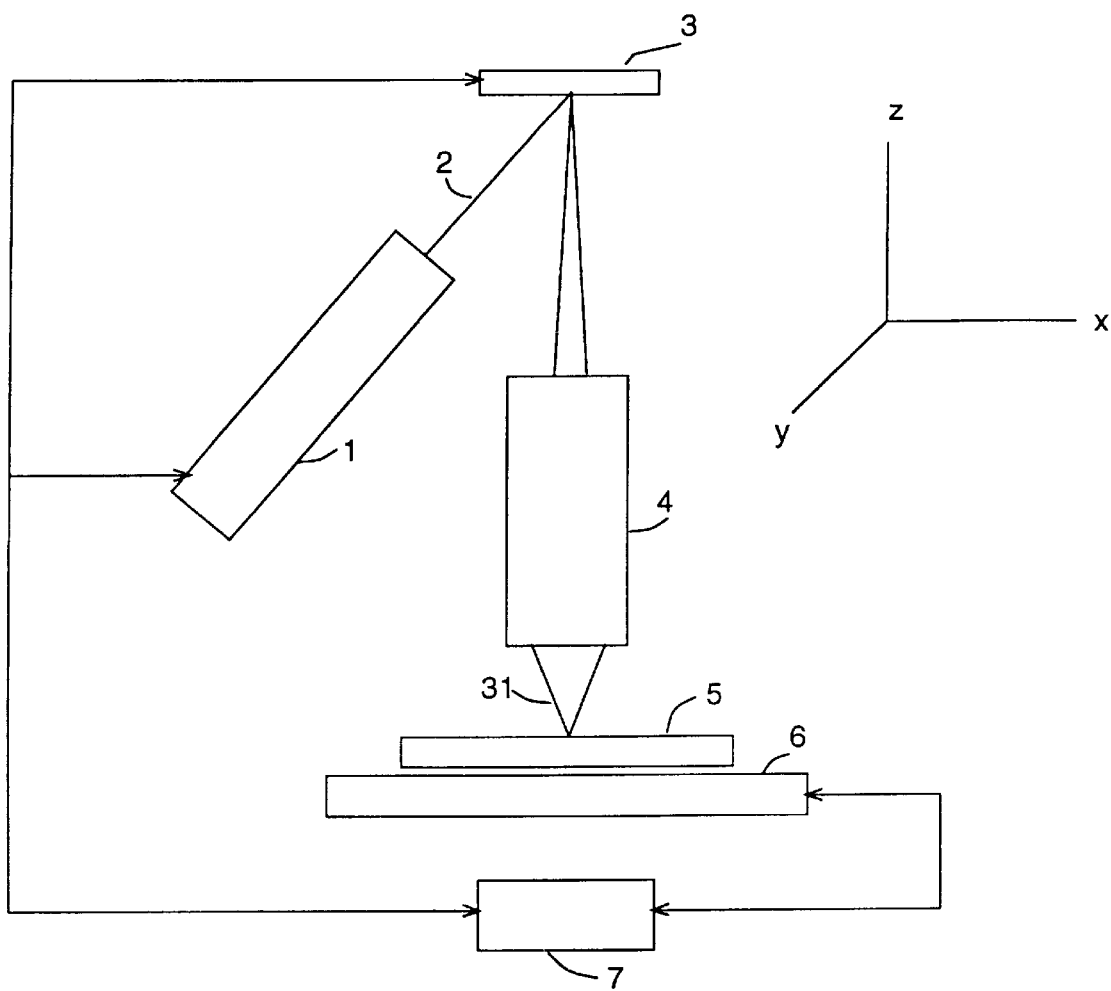
FIG. 1 is a schematic presentation of an embodiment of the invention wherein the spatial light Modulator is a deformable micromirror device (DMD).

FIG. 1 is a schematic illustration of a preferred embodiment of the maskless lithography system. The illumination for exposure is provided by a radiation source 1 with output beam 2. The output beam 2 then illuminates a spatial light modulator, shown in FIG. 1 as a deformable micromirror device (DMD) 3, which is an array of micromirrors on a chip with electronic logic, memory and control that enable the individual mirrors to tilt in different directions for selective reflection or deflection of individual pixels. The illuminated DMD pixels which are reflective are imaged by a projection lens 4 onto a substrate 5 which rests on a scanning stage 6. The reduction power of the lens determines the resolution of the invention for a particular DMD pixel size. For example, a lens with reduction of 10:1 will produce a pixel size on the substrate which is one tenth the size of an individual micromirror.

The substrate is scanned as shown in FIG. 1 along, say, the y-axis. Simultaneously, control system 7 feeds a stream of pixel selection data to the DMD array 3, thus causing the micromirror elements to tilt in the correct orientation. The illuminated pixel pattern imaged onto the substrate 5 by the radiation source thus represents an instantaneous snapshot of the set of micromirrors at that moment in time. In order to ensure that the pattern imaged onto the substrate is not blurred, the pixel selection data stream configuring the DMD array 3 must be synchronized with the motion of the scanning stage 6. The radiation illuminating the DMD array 3 must also be pulsed or shuttered at a repetition rate that is synchronized with the micromirrors on the DMD array 3 and the scanning stage 6. That is, each time the DMD array 3 is illuminated by the radiation source that is part of illumination system 1, the DMD pixels will already be reset by the pixel selection data to generate a different pattern when imaged to the substrate 5. After completion of a scan along the y-axis, the stage 6 is moved by a suitable amount along an orthogonal axis (x-axis), following which another scan is generated along the y-axis, and so on.

The Radiation Source

The radiation source 1 is preferably a pulsed laser with a characteristic wavelength that is compatible with the spectral sensitivity of common photoresists, although a continuous wave source, such as a suitably pulsed or shuttered lamp matched to photoresist spectra is acceptable. A pulsed beam, such as is produced by a pulsed laser system with a wavelength between 250 nm and 350 nm, has a repetition rate that is tied to be synchronous with the data stream that configures the micromirror array and with the scanning stage. Synchronization is accomplished by control system 7. The preferred radiation source operates at a repetition rate that is close to the rate at which the elements of the spatial light modulator are capable of switching back and forth, in order to maximize throughput. Throughput is affected because the data rate determines the speed at which the scanning stage must move, in order to maintain uniform dosage along the scan direction. The duration of the illuminating pulse of light, $\Delta t$, is determined by the following expression:

$$\Delta t \cdot v \gg \Delta y \quad (1)$$

where v is the velocity of the stage 6 moving the substrate 5, and $\Delta y$ is the desired minimum feature size of the projection system 4. If the pulse duration is too large, then the generated image will be blurred. It is possible to compensate for a longer pulse duration by reducing the velocity of the stage. While this reduces the throughput of the system, it could be a lower cost option. Conventional excimer laser systems have pulse durations on the order of 10–40 ns. If the substrate is scanned at 250 mm/s, then the product $\Delta t \cdot v$ would be about 0.01 $\mu$m. This is more than adequate for an imaging system with a desired minimum feature size of 1 $\mu$m.

An alternative embodiment of the invention uses more than one radiation source. These sources may be synchronized to pulse alternately in order to increase the repetition rate of the radiation that illuminates the spatial light modulator. Such an embodiment is capable of higher throughput but costs more than an embodiment with one radiation source.

If a continuous wave (CW) source is used, then the radiation source must be shuttered at the appropriate frequency and with the proper duty cycle to meet the condition given in equation (1) above. Alternatively, one could reduce the stage 6 speed so that the image quality is maintained. As an example, if one uses a CW lamp as the radiation source, then the stage 6 velocity must be reduced to much less than 4 mm/s, assuming that pixel selection data can be fed to the spatial light modulator at 4 kHz. While this represents a system which would have much lower throughput, it would also be a lower cost system.

Seamless Scanning Patterning System

Seamless scanning patterning technology, invented by K. Jain, is employed in this invention to obtain high resolution by optimizing the numerical aperture of the projection lens for a reasonable field diameter, and also to deliver that high resolution over practically an unlimited-size exposure area by scanning the length of the board with a beam that is suitably shaped so as to allow adjacent scans to be seamlessly joined.

Prior to this invention, seamless scanning patterning technology has been used with masking technology to expose a desired pattern on an electronic module. Although this invention eliminates the need for a mask, a preliminary description of seamless scanning when used with a conventional mask will nevertheless aid in understanding the maskless nature of this invention. The means by which this invention eliminates masking technology is discussed more fully later, in the subsection entitled Spatial Light Modulator. Thus, the description which immediately follows describes how the seamless scanning technology has been demonstrated when used with a mask.

Figure 2:
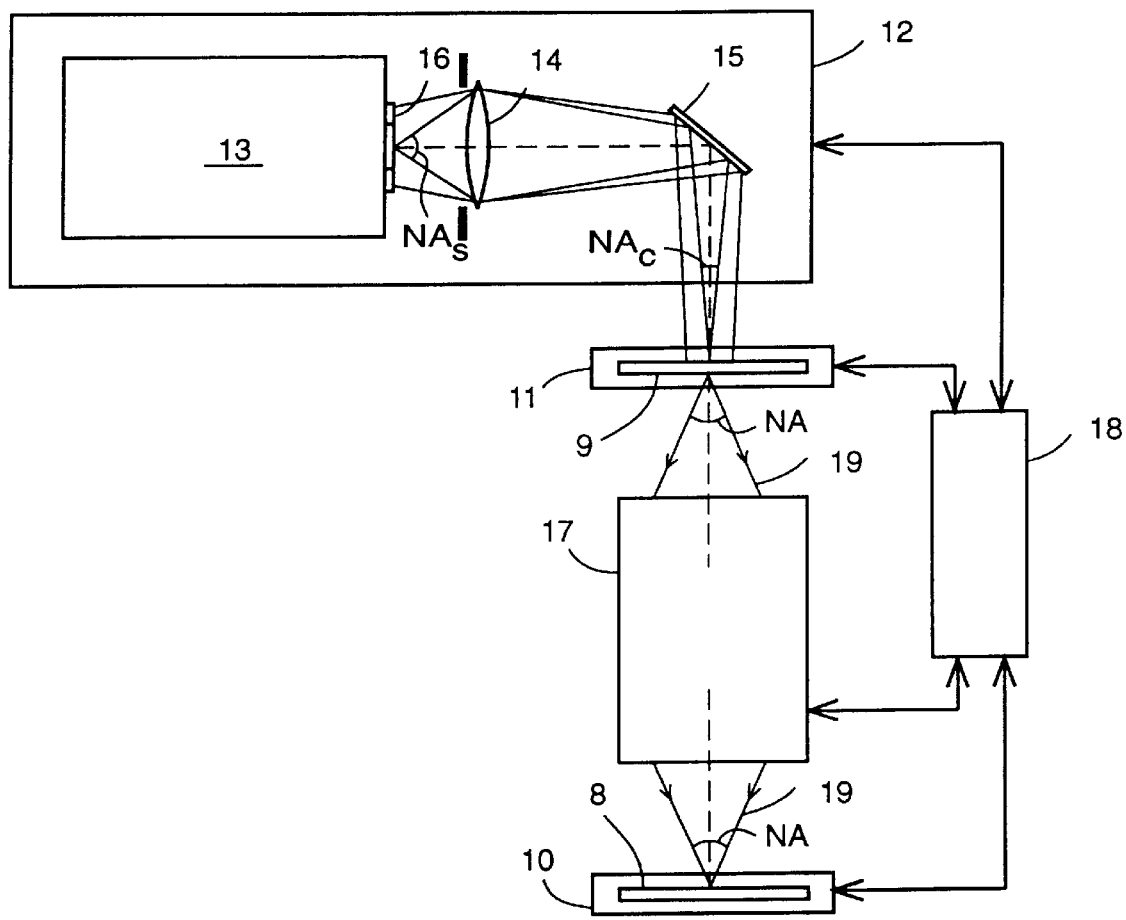
FIG. 2 is a schematic presentation of a prior art imaging system which uses a conventional mask.

FIG. 2 schematically illustrates a scan-and-repeat patterning system when used with a mask 9. The substrate 8 and the mask 9 are each held rigidly in a substrate stage 10 and a mask stage 11, respectively. Both the substrate stage 10 and the mask stage 11 move in synchronism with fine precision. The illumination system 12 consists of a source system 13, a relay lens 14, and beam steering optics 15. The source system 13 is such that its effective emission plane, 16, is in the shape of a regular hexagon. The relay lens 14 collects radiation into a certain numerical aperture, $NA_S$, from the effective emission plane and directs it with a certain magnification and numerical aperture, $NA_c$, on the mask 9. A projection lens assembly 17, which may consist of several individual lens elements and prisms or mirrors, forms a precise image of the high-resolution pattern contained within the illuminated hexagonal region on the mask 9 onto the substrate 8. The projection lens 17 has a numerical aperture NA determined by the resolution requirements of the patterning system and is designed for as large a circular image field as possible.

The substrate stage 10 scans the substrate 8 across its hexagonal exposure region so as to traverse the length of the substrate in the direction of the scan. Simultaneously, the mask stage 11 scans the mask 9 across its hexagonal illuminated region. After completion of a scan, both stages 10 and 11 move in a direction orthogonal to the scan direction. Following such a lateral movement, a new scan is generated by precise movements of the substrate stage 10 and mask stage 11 in the same manner as before. The effective scan width and the illumination source system 12 are designed with such characteristics that in combination, they produce a transition, from one scan to the next, that is "seamless" and free from non-uniformities in intensity. The above exposure process, thus termed a "scan-and-repeat" mechanism, is repeated until the entire substrate is exposed. The projection assembly 17 also incorporates an automatic focus system. A control system 18 is functionally coupled to the illumination system 12, the mask stage 10 and substrate stage 11, and the projection lens assembly 17. Control system 18 ensures that the mask stage 10 and substrate stage 11 are focused and aligned appropriately with respect to the projection lens assembly 17 at all times, that the mask stage 10 and substrate stage 11 perform the scan and repeat movements with the desired synchronism, and that the illumination system 12 maintains the desired illumination characteristics throughout the exposure of the entire substrate 8.

Figure 3:
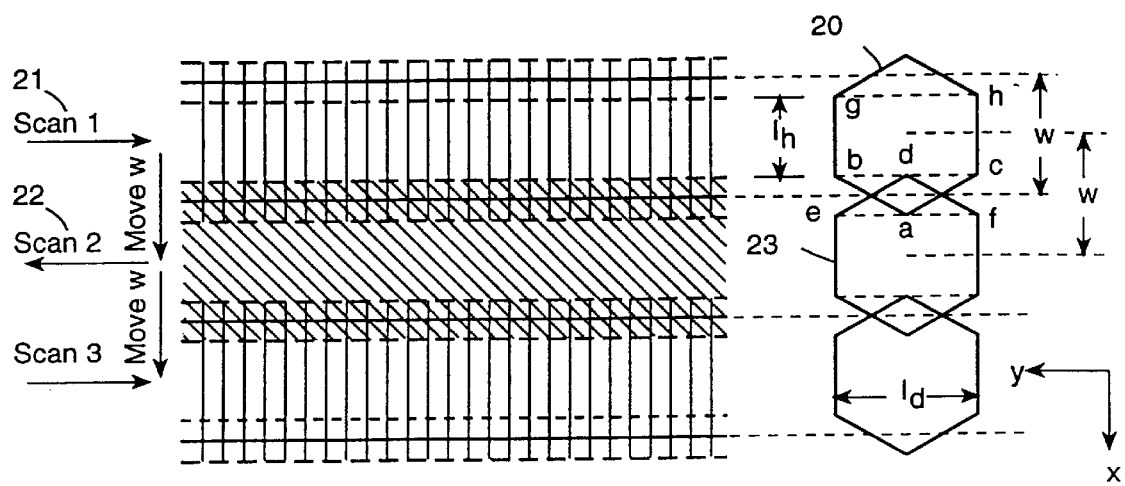
FIG. 3 is a diagram of hexagonal overlap seamless scanning according to the prior art imaging system of U.S. Pat. No. 4,924,257.

FIG. 3 illustrates how seamless scanning is achieved by the apparatus of FIG. 2. The hexagon 20 represents the potentially illuminated portion of the substrate 8 at any given moment. (Likewise, a hexagonal illumination appears on the mask, which is seamlessly scanned in a similar fashion, because the mask moves in synchronization with the substrate.) The substrate is scanned across this illumination region from right to left. It is important to note that the illumination beam itself (19 in FIG. 2) is stationary, as is the projection lens assembly.

Thus, for pictorial illustration, the movement of the substrate 8 across the beam is depicted as the scanning, from left to right, of the hexagonal illumination region across a stationary substrate 8. This movement is depicted by Scan 1 21 in FIG. 3. Because one side of the hexagon c-h is orthogonal to the scan direction, the region of the substrate that is illuminated by triangular region a-b-c receives a smaller exposure dose than does the part of the substrate that is illuminated by the rectangular portion b-g-h-c of the hexagon. However, if the subsequent scan, Scan 2 22 in FIG. 3, is generated at the correct distance from Scan 1 21, then the triangular area a-b-c in hexagon 20 is re-swept in Scan 2 22 by triangular area d-e-f in hexagon 23. The correct distance between scans is achieved when, after completion of a scan, both stages move in a direction orthogonal to the scan direction by an amount termed the "effective scan width". This distance is determined as effective scan width=w=1.5$I_h$, where $I_h$ is the length of each side of the hexagon.

The region in FIG. 3 where triangular areas a-b-c and d-e-f overlap receives an integrated exposure dose that is the same as the dose received by the non-overlapping regions. Thus, the transition from Scan 1 to Scan 2 (and therefore across the substrate) is seamless in exposure dose uniformity, because the overlapping doses provided by hexagons 20 and 23 taper in opposite directions, from maximum to zero at outermost points a and d, respectively.

The seamless scanning patterning technique described above has been incorporated into this invention in a form which eliminates the need for masking technology. Instead of a conventional mask, a spatial light modulator is incorporated to function as a kind of programmable mask, which makes the invention suitable for rapid prototyping, flexible manufacturing, and mask making. Two preferred embodiments of the spatial light modulator are described below.

Spatial Light Modulator

The need for conventional masks is obviated by the use of a spatial light modulator (SLM), which is a programmable device that produces an output optical beam that is modulated by separate inputs from a computer. The SLM simulates the function of a mask through the generation of bright and dark pixels in response to computer-fed data. A preferred embodiment for the SLM is a deformable micromirror device (DMD), to be described first, and an alternative embodiment is a liquid crystal light valve (LCLV), described later.

Figure 4:
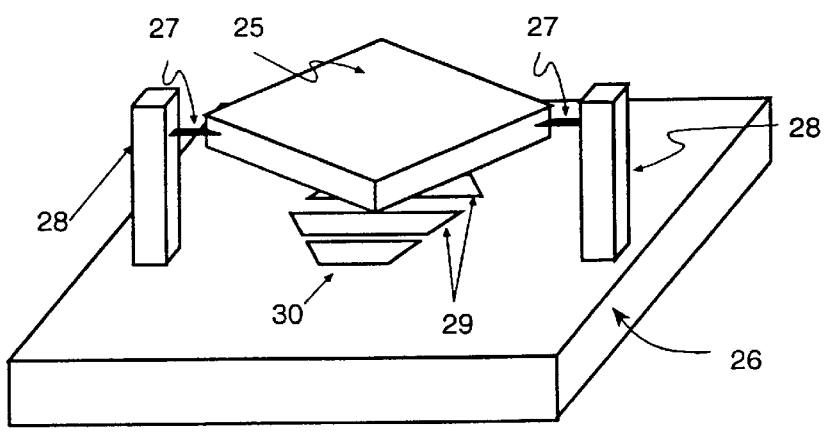
FIG. 4 is semi-schematic diagram of one micromechanical element of a DMD array.

Deformable Micromirror Device (DMD):

A DMD is a spatial light modulator array of etched solid state micromirrors. FIG. 4 shows a schematic of one micromechanical element 25 of a micromirror array 3. Each micromirror element 25 is suspended above the silicon substrate 26 by torsion hinges 27 from two support posts 28 at two corners of the mirror. Beneath the micromirror element 25 are two address electrodes 29 and two landing pads 30 which are addressed from the memory cell immediately below them. The micromirror 25 and the address electrodes 29 act as a capacitor so that a negative bias applied to the micromirror 25, along with a positive voltage to one of the address electrodes 29, drives the micromirror 25 to the landing electrode 30 adjacent to the positive electrode 29. The torsion hinges 27 suspending the micromirror 25 can twist to allow the micromirror to rotate along the diagonal axis until one corner of the micromirror lands on the landing electrode 30.

The micromirror operates in binary digital mode or in trinary digital mode. DMD arrays that function in trinary digital mode have three possible states: "on," "off," or "flat." When operating, each micromirror 25 is twisted to the "on" or "off" state; however, when no power is applied to the array it relaxes to the flat state. Thus, in operation, each micromirror stays latched in an "on" or "off" position until a new piece of data is loaded from the memory cell. When a micromirror is tilted in one direction, it reflects light through the optical system for imaging and is described as being "on." In the "off" state, a micromirror is tilted in the other direction and directs light so that it does not pass through the optical system.

Since the substrate 5 rests on a scanning stage 6 which moves at a constant velocity, each pulse that illuminates the DMD array 3 and is imaged onto the substrate 5 will illuminate a different part of the substrate. The DMD 3 operates so that the entire array of micromirrors can be reconfigured for each pulse to form the correct image on the substrate 5. If the projection lens assembly 4 is of a conventional design with all refractive elements, it will form a reversed image of the DMD 3 on the substrate 5. In the prior art seamless scanning technology, special reversing optics were required to correct for image reversal resulting from the projection lens. This invention, however, does not require an image reversing system to properly orient the image on the substrate. Instead, the desired image is digitized and loaded onto the DMD array as a stream of data in such a sequence that it corrects for image reversal. The invention also eliminates the need for a scanning translation stage for the mask assembly required by the prior art seamless scanning technology. The physical footprint of the overall lithography system is thus reduced, as are alignment and handling constraints. Furthermore, constraints on the translation stage are also significantly reduced.

As described above, the DMD performs the role played by the mask in a FIG. 2 imaging projection system by means of the control system, which dynamically addresses the micromirrors for each position of the stage. The desired image on the substrate is digitized and fed to the DMD array as a stream of data in a similar fashion as used in direct-write systems or parallel by pixel group for faster setting. A difference between the invention and conventional direct-write methods is that the parallel processing power of the DMD can be utilized to project images of more than 1 million pixels per frame at a rate that can be greater than several kiloHertz. In comparison, existing direct-write systems are typically 1000 times slower, because they relay data in a slow, bit by bit fashion.

Referring to FIG. 1, as the stage 6 moves at constant velocity in the y direction, the substrate 5 is illuminated by a beam pattern 31. The illuminated pattern imaged onto the substrate 5 at any given moment represents a particular orientation of the DMD array 3. By the time the next laser pulse illuminates the substrate 5, the stage 6 has moved by an amount that is a fraction of the width of the illumination beam 31. Each point of the substrate 5 that is to be patterned is illuminated by several different pulses as the stage 6 carries the substrate 5 through the illumination beam pattern 31. This effect integrates the energy along the scan direction and improves the uniformity of the delivered dose along that axis.

The number of pulses that illuminates a certain point on the substrate 5 is determined by the repetition rate of the laser, the speed of the stage 6, and the size of the illumination area. It is desirable to have a certain minimum number of pulses to illuminate each point on the substrate 5 in order to achieve a uniform integrated dose along the scan direction. It is possible to increase the number of pulses illuminating each point by decreasing the stage 6 speed, but this also reduces the throughput of the system so this is not desirable. In principle it could be achieved by increasing the repetition rate of the laser, but, in practice, this can be difficult. With this invention, it is possible to have more than one spatial light modulator in the object field of the reduction lens 4 to increase the number of pulses illuminating each point of the substrate 5. The same data stream can be fed to each of the spatial light modulator arrays with a temporal delay between the streams determined by the physical separation between the edges of the arrays. This added flexibility is a powerful feature of this invention, making it easier to design lithography tools to meet the industry's demands.

In order to begin an adjacent scan when a scan is completed, the stage 6 moves in a direction orthogonal to the y-direction scan, i.e., in the x direction. Control of the displacement of the stage 6 in the x-direction is important to maintaining seamless exposure from one scan to the next. If the intensity profile across each scan (in the x-direction) were constant, then the stage 6 would have to move in the x-direction by an amount exactly equal to the scan width. Perfect "seamless" butting of adjacent scans would then be required in order to avoid tiling errors. However, it is not feasible in manufacturing to achieve perfect butting; hence, the scan-and-repeat exposure mechanism described above is used in conjunction with the electronically programmed micromirror array 3, to achieve seamless scanning.

As discussed above, in the subsection entitled Seamless Scanning Patterning Technology, stitching errors can be eliminated through the use of a hexagonal illumination pattern (see also FIG. 3). That is, one could illuminate the DMD 3 with a beam whose transverse profile is that of a hexagon which transcribes the array of micromirrors, as shown in FIG. 5. Thus, in FIG. 5, shaded area 32 depicts the laser illumination area on the DMD array 3. In addition to using the hexagon, other polygonal illumination geometries may be used, such as trapezoids and parallelograms. It is also possible to illuminate the entire DMD array and use the array itself to generate the intensity profile characteristic of, for example, a scanning hexagonal field. Using this method, seamless joining of scans is achieved through electronic programming of the micromirror elements. The elements are individually programmed in such a way as to provide a uniform intensity profile across adjacent scans.

Figure 7:
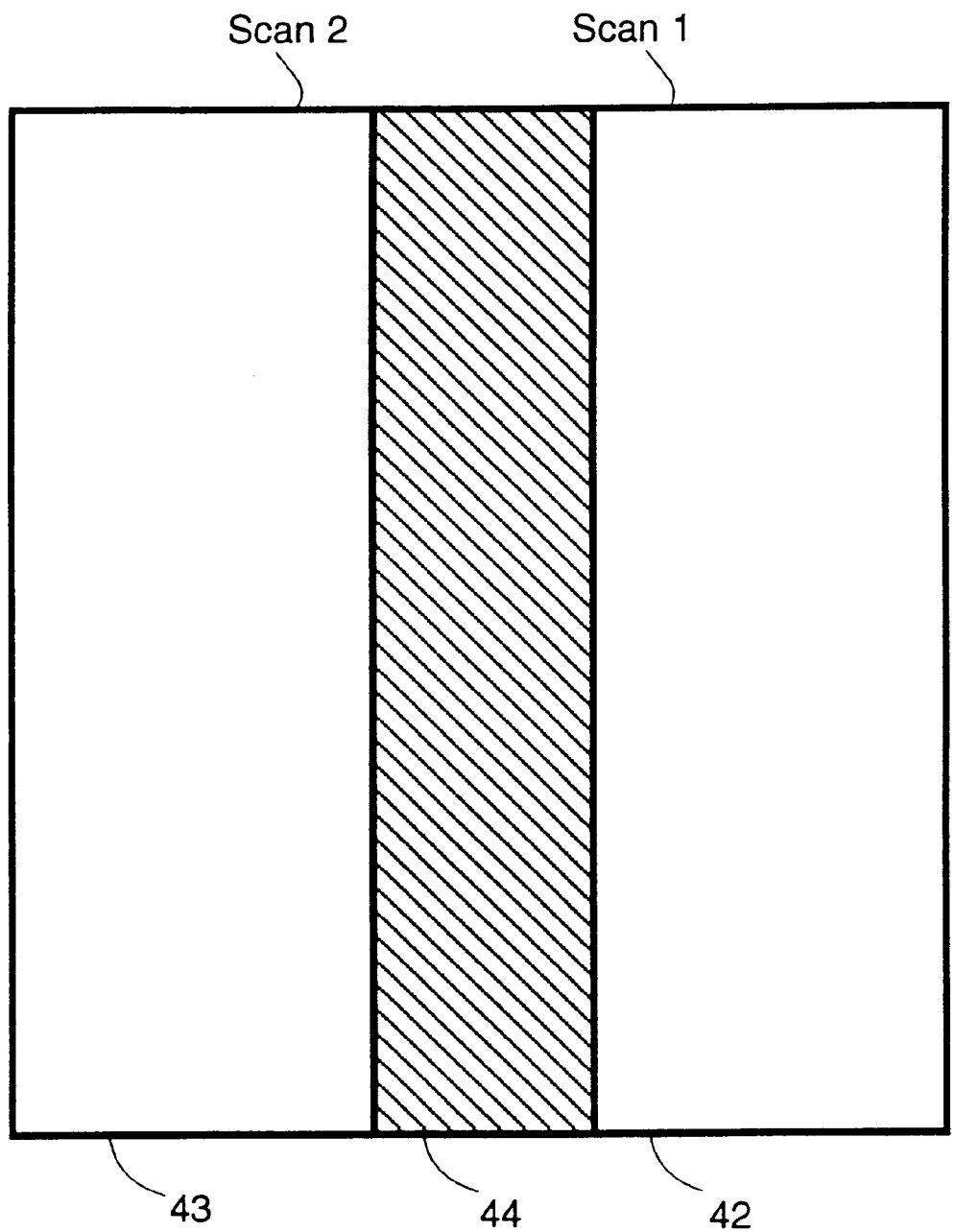
FIG. 7 shows how adjacent optical image fields are exposed in a complementary fashion.
Figure 8:
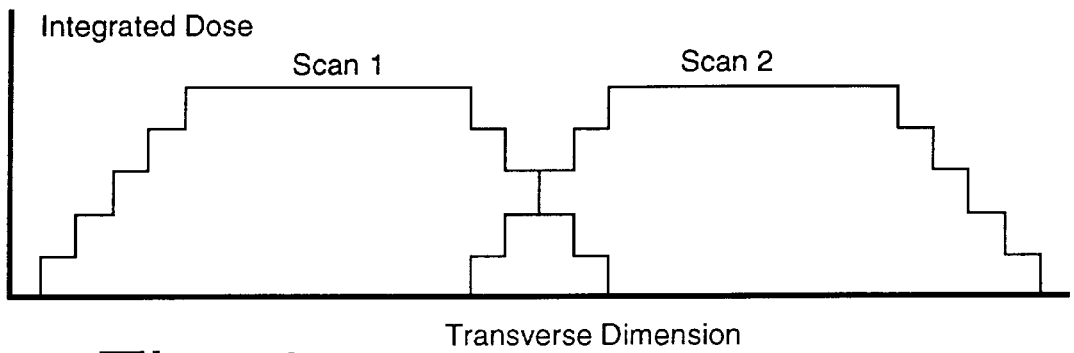
FIGS. 8 and 9 are stylized drawing showing how the tiling effect is eliminated by complementary scans.
Figure 9:
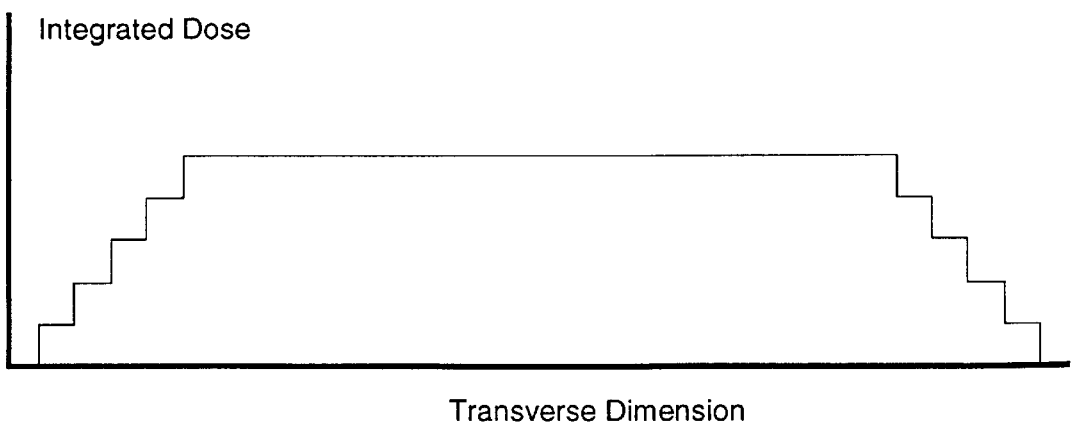

To illustrate this embodiment of the invention, namely how it accomplishes seamless joining of scans by electronic programming, it may be clearer first to describe the hypothetical situation in which every point on the substrate is illuminated evenly and seamlessly, with no pattern being transferred. In such a scenario, the micromirrors that are in the center region 33 of the array are programmed to be "on" full-time, as illustrated in FIG. 6A. Successive rows 34 through 37 and 38 through 41 of micromirrors that approach the edge region of the array are programmed so that their mono times gradually decrease, in a staircase fashion, to zero, as shown in FIG. 6A. Thus, a profile of the intensity produced across one scan appears to taper to zero in a stepwise fashion towards the edges, as shown in FIG. 6B. When an adjacent scan 42 is generated, it partially overlaps the previous scan 43, as illustrated in FIG. 7, along area 44, the region of partial overlap. Uniform intensity across the width of the adjacent scans is achieved by integrating the intensities of the edge profiles, as shown in FIGS. 8 and 9.

In reality, individual micromirrors are unlikely to be "on" full-time, because they are needed to generate a pattern on the substrate—not to illuminate the entire board, as described above. The micromirrors must therefore be programmed to flip "on" or doffs so that the DMD array reflects the appropriate image onto the moving substrate.

The preferred method of achieving seamless scanning, however, is the technique described above, in which successive rows of elements that approach the lateral edges of the array are turned "on" for successively shorter periods of time. The advantage of this technique is that it allows for the electronic programming to overcome irregularities in the intensity profile of the reflected pattern, thus ensuring uniform image intensities across successive scans. Irregularities may be caused by gaps between adjacent DMD chips and also by the possibility of micromirror elements that are defective. The errors caused by defective elements that do not flip back and forth can be minimized because each point of the substrate that is to be patterned is illuminated by many pulses that are imaged from the DMD array. Each time a pulse illuminates a point on the substrate, then, the point is illuminated by a different micromirror element, because the substrate is moving continuously. Thus, an error caused by a single micromirror element is, in effect, integrated out by the series of correct images that illuminate the same point on the substrate.

Liquid Crystal Light Valve (LCLV)

A liquid crystal light valve is an electro-optic device which is programmable and has an array of optically active pixels that can be directly addressed by a control system. Thus, the pattern of modulation that is desired to be sent through the LCLV's output beam is a digital image that has been stored and is fed to the LCLV as a stream of data. When the pixels in the array are addressed, the transmission through the liquid crystal medium is modulated, and the modulation is transferred to a beam of radiation transmitted through the light valve to create the pattern which is to be imaged on the substrate. Thus, the individual pixels are either transmissive or opaque.

The transmissive pixels of the LCLV embodiment are functionally analogous to the micromirrors of the DMD embodiment (described above) that are tilted in the "on" position, because they allow radiation to be imaged on a point of the substrate. The opaque pixels of the LCLV embodiment are the functional equivalent of the "off" micromirrors of the DMD embodiment, because they do not allow radiation to pass through the system for imaging. However, while opaque LCLV pixels do not permit radiation to be transmitted through the light valve, micromirrors on the DMD that are in the "off" position prevent radiation from passing through the imaging system by deflecting the radiation out of the imaging path.

Figure 10:
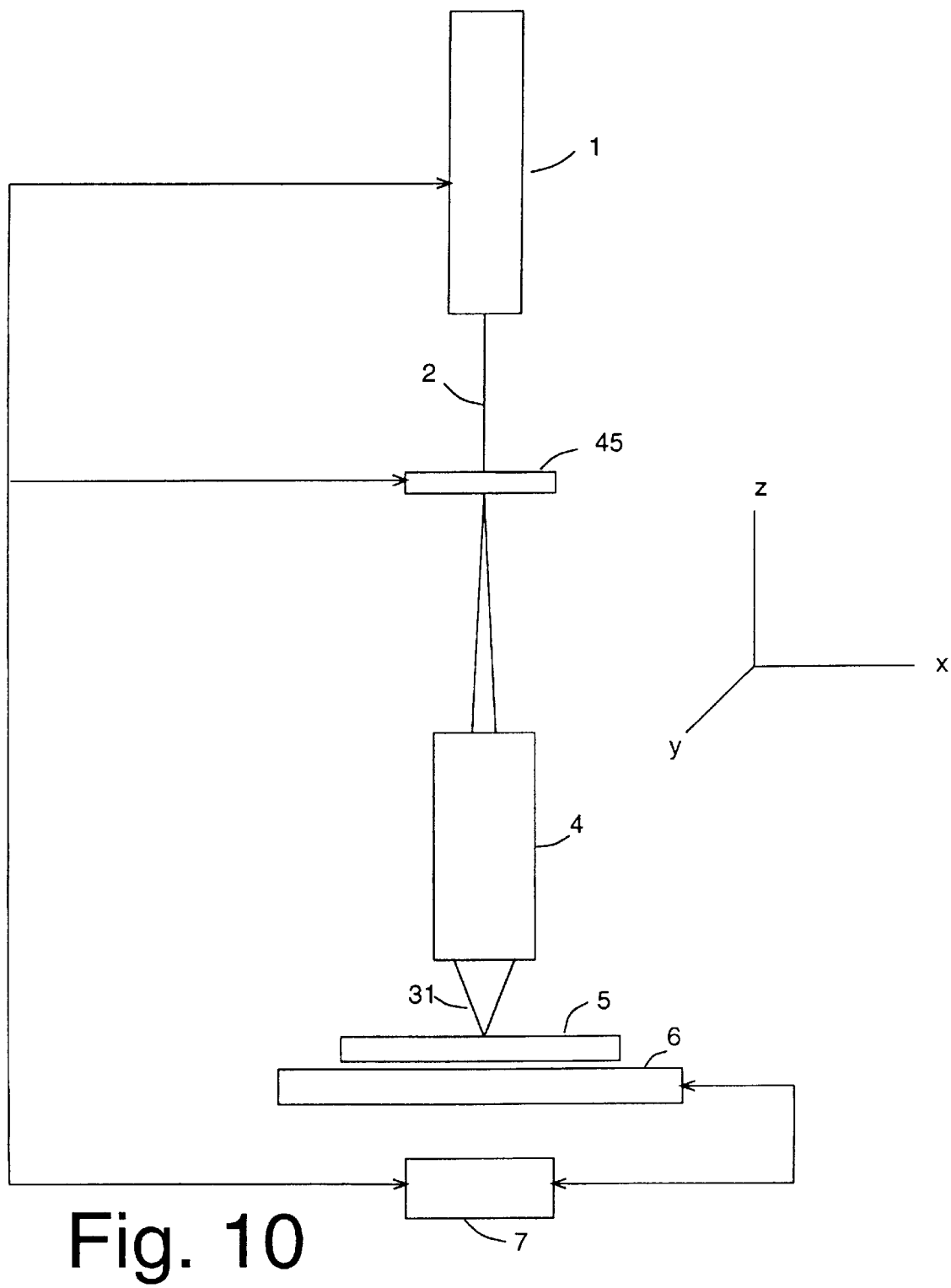
FIG. 10 is a schematic presentation of an embodiment of the invention wherein the spatial light modulator is a liquid crystal light valve (LCLV).

Unlike the DMD, which works in reflective mode, the LCLV is used in transmissive mode to transmit the displayed images through the optical system. However, in this invention, the embodiment that uses a LCLV is otherwise similar in function to the embodiment that uses a DMD as a spatial light modulator. FIG. 10 is a schematic illustration of the embodiment of the invention that uses the LCLV 45. The primary difference between FIG. 10 and FIG. 1, other than the choice of spatial light modulator (i.e., the LCLV 45), is the fact that the LCLV embodiment shown in FIG. 10 enables radiation leaving the radiation source 1 to pass through the LCLV for transmission to the projection lens 4, whereas in the DMD embodiment shown in FIG. 1, radiation leaving the source 1 for imaging is reflected by the DMD 3 toward the projection lens 4.

Industrial Applicability

The lithography system disclosed herein has applicability in the fabrication and manufacturing of diverse electronic and opto-electronic products. In particular, because the invention eliminates the need for masks, it is ideally suited for rapid prototyping and flexible manufacturing of electronic modules. Surprisingly, it is particularly useful for mask making, because of the quick turnaround of corrections if the mask pattern does not fit the task in all respects. Additionally, it provides the capability to pattern large substrates, even continuous substrates such as flat panel displays (FPDs), while maintaining high resolution and high throughput.

This invention eliminates the need for masks; hence, use of the invention would reduce the long development time and minimize the high costs associated with IC production. Overcoming such limitations enables rapid prototyping of electronic modules. All of the information contained within a standard chrome mask is represented by a stream of data which is fed to a spatial light modulator (SLM). The SLM has the versatility of representing any possible pattern, eliminating the need for multiple masks to image different layers of a semiconductor device.

Due to the seamless scan-and repeat feature of the invention, the system can use a projection lens with a moderate numerical aperture and a field size only a fraction of the board size, thereby producing very high resolution over the entire board area. Thus, the invention combines performance features such as high resolution, large effective image field size, and high processing throughput. The versatility of this invention also makes it useful in manufacturing systems for high-volume electronic products such as flat-panel displays, printed circuit boards, microelectromechanical systems (MEMS) and semiconductor integrated circuits.

When conventional masking technology is used to prototype electronic products, designing and constructing masks places a significant drag on the time required to build the prototype. The process of fabricating an electronic module involves the imaging of appropriate patterns on different layers and requires a different mask for each layer. The time required for switching and aligning masks as well as the expense of maintaining an array of masks for the production of a single selected electronic module represents a significant fraction of the cost of integrated circuit (IC) manufacturing. This can be extremely useful for spare part production and production in very short runs, because it permits a "zero-inventory" decision.

Patterning of substrates of arbitrarily large size, such as large flat panel displays (FPDs), is possible with this invention. First, the spatial light modulator can simulate a mask of unlimited size. This is an important advantage for the production of large FPDs, where the production and handling of large-area masks has represented a significant cost barrier to large FPD production. Also, with its continuous scanning movement and its unique exposure field, the invention can pattern boards of arbitrarily large sizes at fast exposure rates, due to the seamless overlap between adjacent scans. The critical stitching requirements of conventional step-and-repeat tools are thus eliminated. Furthermore, the invention achieves microelectronic patterning significantly faster than focused-beam direct-write systems, which transfer pattern information in a bit-by-bit serial mode. Instead, the invention uses high parallel-processing power to generate any possible pattern, while maintaining high resolution over a large image field.

In summary, the maskless, large-area, high-throughput lithography system fills a critical need in the manufacturing of numerous electronic products required in diverse applications, such as flat-panel displays, printed circuit boards, and semiconductor ICs.

What we claim is:

1. A maskless lithography system for providing a pattern image on an image field of a large-area substrate (5), consisting of:
  a) a radiation source (1) directed onto a selected object plane;
  b) a multi-position spatial light modulator, consisting of a set of deformable micromirror devices, one for each pixel position, illuminated by said radiation source (1) at said selected object plane, being capable of selectively relaying radiation toward the substrate (5), for reflecting radiation from said radiation source (1) through projection means (4) to form an image on the substrate (5) of an array assembly of individual pixel modulators, configured as a momentarily selected composite polygonal spatial light pattern image;
  c) projection means (4) for imaging said momentarily selected composite polygonal pattern image radiation relayed from said set of deformable micromirror devices (3) onto said substrate (5);
  d) a scanning stage (6) upon which said substrate (5) rests, said scanning stage (6) moving at constant velocity so that each momentarily selected composite polygonal pattern image formed by said set of deformable micromirror devices (3) that is projected onto said substrate will illuminate a specific elongated region of the image field of said substrate (5) with composite image intensity varying toward the side edges of said elongated region, until such substrate (5) has been scanned along the length of the image field, at which time said scanning stage (6) moves in a direction orthogonal to the scan direction in order to allow a subsequent partially overlapping polygonal complementary scan along the length of an adjacent elongated region of the image field to take place; and e) a control system (7) comprising electronic programming means to provide a data set to configure each said pixel modulator with a selected composite pixel pattern to result in image with intensity varying toward the side edges of said elongated region, and means to synchronize the movement of said scanning stage (6) with the data stream to said spatial light modulator (3);

wherein said radiation source (1) illuminates the entire set of pixel positions of said spatial light modulator (3), and said electronic programming means configures and reconfigures said pixel positions to generate composite elongated region partial images, each of which varies in dosage across its profile to accomplish overlapping complementary polygonal scanning for seamless imaging.

2. A maskless lithography system according to claim 1, wherein said spatial light modulator array (3) comprises a plurality of separate modules each carrying a subset of said set of deformable micromirror devices; and wherein said control system is programmable to correct by timing of selection of individual pixel positions for deviations in the image patterned on the substrate resulting from separations between individual arrays of deformable micromirror devices.

3. A maskless lithography system for providing a pattern image on an image field of a large-area substrate (5), comprising:

a) a radiation source (1) directed onto a selected object plane;

b) a spatial light modulator array (3), comprising a liquid crystal light valve array for transmitting radiation from said radiation source (1) toward said substrate (5), said liquid crystal light valve being characterized by an array of liquid crystal pixel positions, each of said pixel positions being configured to transmit a selected pixel image onto said substrate (5) configured to form a selected composite polygonal pattern image; illuminated by said radiation source (1) at said selected object plane, being capable of relaying radiation toward the substrate (5) via said liquid crystal light valve;

c) projection means (4) for imaging said selected composite polygonal pattern image radiation relayed from said spatial light modulator array (3) onto said substrate (5);

d) a scanning stage (6) upon which said substrate (5) rests, said scanning stage (6) moving at constant velocity so that each composite pattern image formed by said spatial light modulator (3) that is projected onto said substrate will illuminate a specific region of said substrate (5), until said substrate (5) has been scanned along the length of the image field, at which time said scanning stage (6) moves in a direction orthogonal to the scan direction in order to allow a subsequent partially overlapping polygonal complementary scan along the length of the image field to take place; and e) a control system (7) comprising electronic programming means to provide a data set to configure each said spatial light modulator with a selected composite pattern including light intensity variation toward side edges according to the requirements of complementary overlapping polygonal scanning, and means to synchronize the movement of said scanning stage (6) with the data stream to said liquid crystal light valve.

4. A maskless lithography system for providing a pattern image on an image field of a large-area substrate (5), characterized by:

a) a radiation source (1) directed onto a selected object plane;

b) a spatial light modulator array (3), comprising a liquid crystal light valve array for transmitting radiation from said radiation source (1) toward said substrate (5), said liquid crystal light valve being characterized by an array of liquid crystal pixel positions, each of said pixel positions being configured to transmit a selected pixel image onto said substrate (5) configured to form a selected composite polygonal pattern image illuminated by said radiation source (1) at said selected object plane, being capable of relaying radiation toward the substrate (5) wherein said radiation source (1) illuminates the entire set of pixel positions of said spatial light modulator (3);

c) projection means (4) for imaging said selected composite polygonal pattern image radiation relayed from said spatial light modulator array (3) onto said substrate (5);

d) a scanning stage (6) upon which said substrate (5) rests, said scanning stage (6) moving at constant velocity so that each composite pattern image formed by said spatial light modulator (3) that is projected onto said substrate will illuminate a specific region of said substrate (5), until an elongated region of such substrate (5) has been scanned along the length of the image field with cumulative exposure intensity varying toward the sides of said elongated region, at which time said scanning stage (6) moves in a direction orthogonal to the scan direction in order to allow a subsequent partially overlapping polygonal complementary scan of an adjacent elongated region along the length of the image field to take place; and e) a control system (7) comprising electronic programming means to provide a data set to configure each said spatial light modulator with a selected composite pattern, and means to synchronize to movement of said scanning stage (6) with the data stream to said spatial light modulator (3) to configure said pixel positions to generate a sequence of said selected composite polygonal pattern partial images which varies in illumination dosage across its profile for overlapping complementary polygonal scanning for seamless imaging.

5. A maskless lithography system according to claim 4, wherein said electronic programming means configures said spatial light modulator (3) to generate a partial pattern image which is hexagonal in shape, with overlapping triangles formed by the points of such hexagonal shape at the sides of such elongated regions, for overlapping complementary polygonal scanning for seamless imaging.

6. A maskless lithography system according to claim 4, wherein said electronic programming means configures said spatial light modulator (3) to generate a partial pattern image which is trapezoidal in shape, with overlapping triangles formed by the points of such trapezoidal shape at the sides of such elongated regions, for overlapping complementary polygonal scanning for seamless imaging.

7. A maskless lithography system for providing a pattern image on an image field of a large-area substrate (5), characterized by:

a) a radiation source (1) directed onto a selected object plane;

b) a spatial light modulator array (3) comprising a liquid crystal light valve array for transmitting radiation from said radiation source (1) toward said substrate (5), said liquid crystal light valve being characterized by an array of liquid crystal pixel positions, each of said pixel positions being configured to transmit a selected pixel image onto said substrate (5) configured to form a selected composite polygonal pattern image illuminated by said radiation source (1) at said selected object plane, being capable of relaying radiation toward the substrate (5) wherein said radiation source (1) illuminates an entire set of pixel positions of said spatial light modulator (3);

c) projection means (4) for imaging said selected composite polygonal pattern image radiation relayed from said spatial light modulator array (3) onto said substrate (5);

d) a scanning stage (6) upon which said substrate (5) rests, said scanning stage (6) moving at constant velocity so that each selected composite pattern image formed by said spatial light modulator (3) that is projected onto said substrate will illuminate a specific region of said substrate (5), until such substrate (5) has been scanned along an elongated region of the image field, at which time said scanning stage (6) moves in a direction orthogonal to the scan direction in order to allow a subsequent partially overlapping polygonal complementary scan along the length of the image field to take place; and e) a control system (7) comprising electronic programming means to provide a data set to configure said spatial light modulator array with such selected composite pattern, and means to synchronize the movement of said scanning stage (6) with the data stream to said spatial light modulator array (3) to configure said pixel positions to generate a partial image which varies in illumination dosage across its profile;

wherein said electronic programming means furthermore configures said spatial light modulator (3) to produce an image whose dosage profile tapers off towards its lateral edges, and said scanning stage, upon completion of one scan, is capable of moving in a direction orthogonal to the scan direction in order to be positioned for a subsequent scan, so that said subsequent scan elongated region partially overlaps the prior scan elongated region by an amount which enables seamlessness and uniformity in intensity of the image on the substrate with respect to each prior scan.

8. A maskless lithography system for providing a pattern image on an image field of a large-area substrate (5), characterized by;

a) a radiation source (1) directed onto a selected object plane;

b) a spatial light modulator array (3) having a multiplicity of pixel positions, each of said pixel positions being configured to transmit a selected pixel image onto said substrate (5) configured to form a selected composite polygonal pattern image illuminated by said radiation source (1) at said selected object plane, being capable of relaying radiation toward the substrate (5) wherein said radiation source (1) illuminates an entire set of pixel positions of said spatial light modulator (3);

c) projection means (4) for imaging said selected composite polygonal pattern image radiation relayed from said spatial light modulator array (3) onto said substrate (5);

d) a scanning stage (6) upon which said substrate (5) rests, said scanning stage (6) moving at constant velocity to that each selected composite pattern image formed by said spatial light modulator (3) that is projected onto said substrate will illuminate a specific region of said substrate (5), until such substrate (5) has been scanned along an elongated region of the image field, at which time said scanning stage (6) moves in a direction orthogonal to the scan direction in order to allow a subsequent partially overlapping polygonal complementary scan along the length of the image field to take place; and e) a control system (7) comprising electronic programming means to provide a data set to configure said spatial light modulator array with such selected composite pattern, and means to synchronize the movement of said scanning stage (6) with the data stream to said spatial light modulator array (3) to configure said pixel positions to generate a partial image which varies in illumination dosage across its profile;

wherein said electronic programming means furthermore configures said spatial light modulator (3) to produce an image whose dosage profile tapers off towards its lateral edges, and said scanning stage, upon completion of one scan, is capable of moving in a direction orthogonal to the scan direction in order to be positioned for a subsequent scan, so that said subsequent scan elongated region partially overlaps the prior scan elongated region by an amount which enables seamlessness and uniformity in intensity of the image on the substrate with respect to each prior scan.

9. A maskless lithography system according to claim 8, further characterized in that:

said radiation source is a pulsed laser system having inter-pulse intervals; and said control system (7) comprises means to synchronize the repetition rate of said pulsed laser system with the movement of said scanning stage (6) and with the data stream to said spatial light modulator (3) so that changes to said spatial light modulator takes place during inter-pulse intervals.

10. A maskless lithography system according to claim 8, further characterized in that:

said radiation source (1) is a continuous wave light source equipped with a high speed shutter directed onto a selected object plane, having inter-pulse intervals; and said control system (7) comprises means to synchronize the repetition rate of said pulsed laser system with the movement of said scanning stage (6) and with the data stream to said spatial light modulator (3) so that changes to said spatial light modulator takes place during inter-pulse intervals.

11. A maskless lithography system according to claim 8, further characterized in that:

a) said radiation source (1) is replicated, with each such radiation source (1) directed onto a selected object plane; and said control system (7) comprises electronic programming means to provide a data set to configure each of said replicated radiation sources of said spatial light modulator array with a selected composite pixel pattern, and means to synchronize the movement of said scanning stage (6) with the data stream to said spatial light modulator (3), whereby all of said radiation sources are synchronized to pulse sequentially so as to increase the repetition rate of the radiation that illuminates said spatial light modulator (3).

12. A maskless lithography system according to claim 8, further characterized in that:

said radiation source (1) comprises means for enhancing the uniformity of radiation from said radiation source (1) by multiple reflections and means for treating radiation from said radiation source (1) for desired numerical aperture, directed onto a selected object plane at the surface of said substrate.

13. A maskless lithography system according to claim 12 wherein said radiation source (1) further comprises:

beam shaping means providing a hexagonally shaped beam to illuminate said spatial light modulator array to generate a partial pattern image which is hexagonal in shape, with overlapping triangles formed by the points of such hexagonal shape at the sides of such elongated regions, for overlapping complementary polygonal scanning for seamless imaging.

14. A maskless lithography system to compensate for imaging errors resulting from known individual defective pixel positions in the spatial light modulator (3) wherein said electronic programming means furthermore configures a set of pixel positions of said spatial light modulator (3) to produce an image whose dosage profile tapers off towards its lateral edges, and said scanning stage, upon completion of one scan, is capable of moving in a direction orthogonal to the scan direction in order to be positioned for a subsequent scan, so that said subsequent scan partially overlaps the prior scan by an amount which enables seamlessness and uniformity in intensity of the image on the substrate with respect to each prior scan.

15. A maskless lithography system according to claim 14, wherein said radiation source (1) illuminates the entire set of pixel positions of said spatial light modulator (3), and said electronic programming means configures and reconfigures said pixel positions during a scan to generate a partial image which varies to compensate for defective pixel positions.

* * * * *